United States Patent
Shirakawa et al.

(10) Patent No.: US 6,525,950 B1
(45) Date of Patent: Feb. 25, 2003

(54) SEMICONDUCTOR DEVICE AND ELECTRIC POWER CONVERSION DEVICE

(75) Inventors: Shinji Shirakawa, Hitachi (JP); Hideshi Fukumoto, Hitachinaka (JP); Akira Mishima, Hitachi (JP); Keiichi Mashino, Hitachinaka (JP); Toshiyuki Innami, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/653,164

(22) Filed: Sep. 1, 2000

(30) Foreign Application Priority Data

Mar. 30, 2000 (JP) ........................................ 2000-097816

(51) Int. Cl.[7] ................................................ H02M 1/00
(52) U.S. Cl. ........................ 363/144; 363/132; 307/148
(58) Field of Search ................................ 363/144, 132, 363/137, 98, 17; 307/147, 148

(56) References Cited

U.S. PATENT DOCUMENTS

| | | | |
|---|---|---|---|
| 4,907,068 A | | 3/1990 | Amann et al. |
| 5,132,896 A | | 7/1992 | Nishizawa et al. |
| 5,172,310 A | * | 12/1992 | Deam et al. ................. 363/144 |
| 5,623,399 A | * | 4/1997 | Ishii et al. ................... 363/144 |
| 5,748,456 A | * | 5/1998 | Bayerer ....................... 257/678 |
| 6,024,060 A | * | 2/2000 | Tanaka et al. ............... 363/132 |
| 6,028,779 A | * | 2/2000 | Sakamoto et al. .......... 363/132 |

FOREIGN PATENT DOCUMENTS

| | | |
|---|---|---|
| EP | 0649215 | 4/1995 |
| JP | 1022451 | 11/1989 |
| JP | A-7-311552 | of 1995 |
| JP | A-8-140363 | of 1996 |

* cited by examiner

Primary Examiner—Jeffrey Sterrett
Assistant Examiner—Gary L. Laxton
(74) Attorney, Agent, or Firm—Crowell & Moring LLP

(57) ABSTRACT

A semiconductor power conversion device includes two bridge-connected semiconductor switches, an output terminal, and first and second pairs of positive and negative direct current terminals. First conductors connect the negative direct current terminals of the first and second pairs with the output terminal through one of the two bridge-connected semiconductor switches, while second conductors connect the positive direct current terminals of the first and second pairs with the other of the two bridge-connected semiconductor switches. A housing is provided, which includes the two bridge-connected semiconductor switches, and at least a portion of the first conductor and of the second conductor as a multilayer structure formed by sandwiching an insulator between the first and second conductors inside the housing. The first and second pairs of direct current terminals are arranged on one side of one plane of the housing.

11 Claims, 5 Drawing Sheets

SEMICONDUCTOR DEVICE AND ELECTRIC POWER CONVERSION DEVICE

BACKGROUND OF THE INVENTION

1. Field of the Invention

The present invention relates to a semiconductor device and an electric power conversion device.

2. Description of Related Art

Conventionally, JP-A-7-311552 has disclosed an inner wiring structure of a semiconductor device, and JP-A-8-140363 has disclosed a wiring structure of connecting an electrolytic capacitor with the semiconductor device in an electric power conversion device. These technologies have disclosed the formation of a multilayer structure with an objective that, in the semiconductor device inner-wiring and the wiring of connecting the electrolytic capacitor with the semiconductor device in the electric power conversion device, the direction of an electric current flowing in a positive-polarity side wiring and that of an electric current flowing in a negative-polarity side wiring becomes opposite to each other. Here, an object of the above-described formation is to decrease inductances that become the causes of an increase in the loss at the time of a switching and of an occurrence of a voltage exceeding an element withstand voltage.

SUMMARY OF THE INVENTION

It is an object of the present invention to provide a semiconductor device and an electric power conversion device that make it possible to reduce the inductances.

The above-described prior arts reduce the inductances individually in the semiconductor device inner-wiring and the wiring of connecting the electrolytic capacitor with the semiconductor device in the electric power conversion device, the inductances becoming the causes of the increase in the loss at the time of the switching and of the occurrence of the voltage exceeding the element withstand voltage. In the above-described prior arts, no consideration has been given to the reduction of the inductances as a whole including inductances that occur in the wiring of connecting the electrolytic capacitor with the semiconductor device and a connection portion of a direct current terminal of the semiconductor device.

According to one point of view of the present invention, the present invention is characterized by the following semiconductor device or an electric power conversion device using the semiconductor device: An insulator is sandwiched between at least a portion of a positive-polarity side conductor and at least a portion of a negative-polarity side conductor that bridge-connect semiconductor switches in the semiconductor device, thereby multilayering the portions. Then, positive-polarity direct current terminals and negative-polarity direct current terminals, the numbers of which are at least 2 each, are provided in such a manner as to form pairs with the positive-polarity side conductor and the negative-polarity side conductor, the positive-polarity direct current terminals and the negative-polarity direct current terminals being provided on one side of an upper plane of a case of the semiconductor device.

In the present specification, a housing of the semiconductor device has at least the case and a baseboard. Also, there are some cases where the positive-polarity direct current terminals and the negative-polarity direct current terminals are simply referred to as direct current terminals. Also, there are some cases where, when 2 positive-polarity direct current terminals or 2 negative-polarity direct current terminals form a pair, they are referred to as a direct current terminal pair, respectively.

In the present invention a semiconductor device and an electric power conversion which can reduce the inductances are provided.

The following description makes even clearer the above-described characteristics and the other characteristics of the present invention.

DESCRIPTION OF THE EMBODIMENTS

Hereinafter, based on FIGS. 1 to 9, the explanation will be given concerning embodiments of the present invention. In FIGS. 1 to 9, the same reference numeral is assigned to the same configuration component or a configuration component having the same function. Also, in order to make the accompanying drawings easy to understand, a driving circuit for driving semiconductor switches is omitted.

Figure 8:
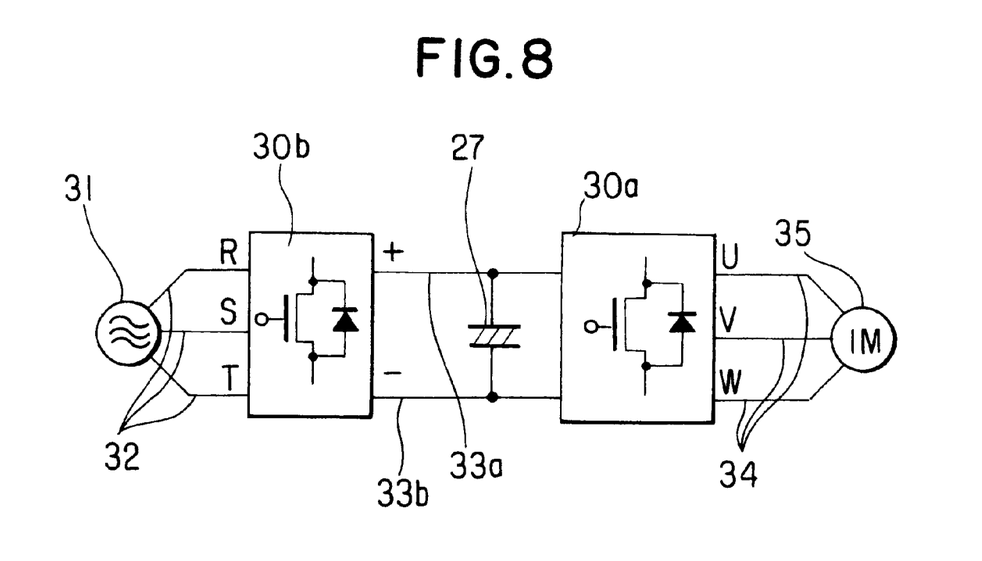
FIG. 8 is a diagram for illustrating an example of the circuit configuration of the electric power conversion device.

FIG. 8 illustrates an example of the circuit configuration of the electric power conversion device. In FIG. 8, the reference numerals denote the following components, respectively: 30a, 30b semiconductor devices, 31 a 3-phase alternating current power supply, 32 input wires, 33a a main circuit wiring, 33b a main circuit wiring, 27 an electrolytic capacitor, 34 output wires, 35 an induction motor (which is also refereed to as a load). The semi-conductor devices 30a, 30b include power semiconductor switch elements such as an IPM, a power MOSFET (Metal Oxide Semiconductor Field Effect Transistor) and an IGBT (Insulated Gate Bipolar Transistor).

The semiconductor device 30b converts the 3-phase alternating current power supply 31 to direct currents, and accordingly it is possible to regard, as a direct current power supply, the semiconductor device 30b combined with the 3-phase alternating current power supply 31. Accordingly, when an input power supply is a direct current power supply such as a battery, it turns out that the electric power conversion device in FIG. 8 has an apparatus configuration where the semiconductor device 30b, the 3-phase alternating current power supply 31 and the input wires 32 are replaced by the direct current power supply. In the present embodiment, in some cases, the combination of the semiconductor device 30b, the 3-phase alternating current power supply 31 and the input wires 32 is also refereed to as a direct current power supply.

The semiconductor device 30a inputs the direct voltage smoothed by the electrolytic capacitor 27, then outputting, to the output wires 34, a 3-phase alternating current with U, V, W phases and variable voltages and variable frequencies. The induction motor 35 is driven by the currents and the voltages supplied through the output wires 34.

Also, although not illustrated in FIG. 8, in addition to the above-described configuration components, the electric power conversion device may further include components such as a circuit substrate, which becomes a control circuit for controlling switching operations of the semiconductor devices 30a, 30b, and a cooling fin and a cooling fan for cooling the semiconductor devices 30a, 30b.

Figure 9:
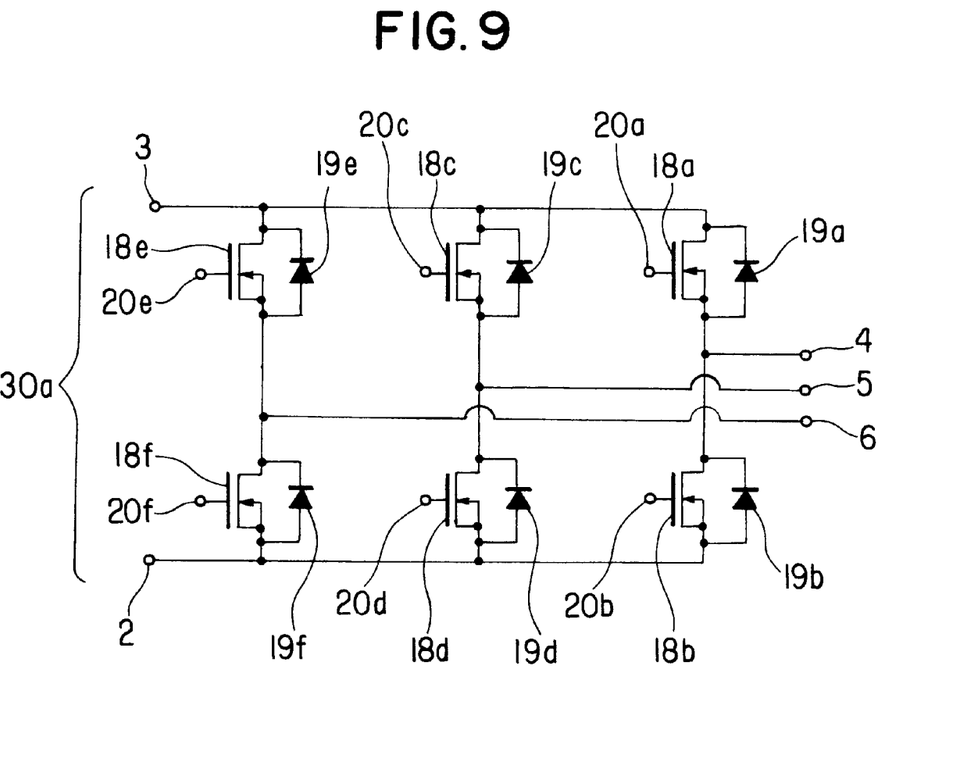
FIG. 9 is a diagram for illustrating an example of the circuit configuration of a semiconductor device for outputting a UVW 3-phase alternating current.

FIG. 9 is a diagram for illustrating an example of the configuration of the semiconductor device 30a for inputting the direct currents so as to output the UVW 3-phase alternating current. In FIG. 9, the reference numerals denote the following components, respectively: 30a the semiconductor device, 18a, 18b, 18c, 18d, 18e, 18f semiconductor switches, 19a, 19b, 19c, 19d, 19e, 19f diodes, 20a, 20b, 20c, 20d, 20e, 20f semiconductor switch control terminals, 3 a positive-polarity terminal, 2 a negative-polarity terminal, 4 a W phase output terminal, 5 a V phase output terminal, 6 a U phase output terminal. Numerals 4, 5, 6 as a whole represents a 3-phase alternating output terminal as one set. The direct voltage is applied between the positive-polarity terminal 3 and negative-polarity terminal 2. Also, in order to make the drawing easy to understand, the driving circuit for driving an ON/OFF signal of the respective semiconductor switches is omitted. The control signal from the driving circuit controls a switching of the respective semiconductor switches 18a, 18b, 18c, 18d, 18e, 18f through the semiconductor switch control terminals 20a, 20b, 20c, 20d, 20e, 20f.

The power MOSFET or the IPM is employed as the respective semiconductor switches 18a, 18b, 18c, 18d, 18e, 18f. In the case where the power MOSFET is used as the respective semiconductor switches, since the power MOSFET includes a diode in its elemental structure, it is possible to configure the semiconductor switch 18a and the diode 19a on one chip. Consequently, when the power MOSFET is employed as each semiconductor switch, the diode need not be implemented as another configuration component.

The semiconductor switch 18a and the semiconductor switch 18b, the semiconductor switch 18c and the semiconductor switch 18d, and the semiconductor switch 18e and the semiconductor switch 18f are bridge-connected to each other, respectively. The semiconductor device 30a applies a PWM (Pulse Width Modulation) control signal voltage to the semiconductor switch control terminals 20a, 20b, 20c, 20d, 20e, 20f so as to control a time of an ON (open) and that of an OFF (close) of the bridge-connected respective semiconductor switches 18a, 18b, 18c, 18d, 18e, 18f. This operation permits the semiconductor device 30a to output the UVW 3-phase alternating current with the variable voltages and the variable frequencies from the 3-phase alternating output terminal 4, 5, 6 to the load 35.

The above-described apparatus configuration for outputting the UVW 3-phase alternating current can also be implemented by using 3 semiconductor devices one of which includes the following components: The positive-polarity terminal 3, the negative-polarity terminal 2, the bridge-connected semiconductor switches 18a, 18b, and the output terminal 6. The present invention relates to a wiring structure of a portion that does not depend on the number of the semiconductor switches and the number of the bridge circuits. This condition makes it possible to apply the present invention to a semiconductor device that includes at least 2 of the bridge-connected controllable semiconductor switches, at least 1 of the output terminal and the positive-polarity and negative-polarity direct current terminals.

In the semiconductor device 30a, when each of the semiconductor switches 18a, 18b, 18c, 18d, 18e, 18f is switched from the ON to the OFF, in an electrical path, the electric current value varies exceedingly. Here, the electrical path is configured by the wiring that bridge-connects the semiconductor switch to be switched from the ON to the OFF, the main circuit wiring 33a, the main circuit wiring 33b, and the electrolytic capacitor 27. At this time, a voltage exceeding the direct voltage that is being applied to the electrolytic capacitor 27 is instantaneously applied to the semiconductor switch to be switched from the ON to the OFF. The amount of the above-described voltage (Hereinafter, this voltage is referred to as a jump-up voltage.) that exceeds the direct voltage is determined by the product of the following two values: A total inductance of an inductance of the above-described path and that of the electrolytic capacitor 27 and a time-differentiation value of the electric current value in the path. Accordingly, an increase in the above-described inductance results in an increase in the applied voltage to the semiconductor switch at the time of the switching. Moreover, when the applied voltage exceeds the element withstand voltage, there occurs the element breakdown.

Accompanying the increase in the jump-up voltage, the switching loss of the semiconductor switch is also increased. This increase in the switching loss becomes one of the causes of a lifetime shortening of the semiconductor switch and of an increase in the cost for cooling.

Also, as the fundamental configuration of the semiconductor device 30b illustrated in FIG. 8 for converting the 3-phase alternating current to the direct currents, it is allowable to employ a configuration that is similar to the fundamental configuration of the semiconductor device 30a illustrated in FIG. 9.

Figure 1:
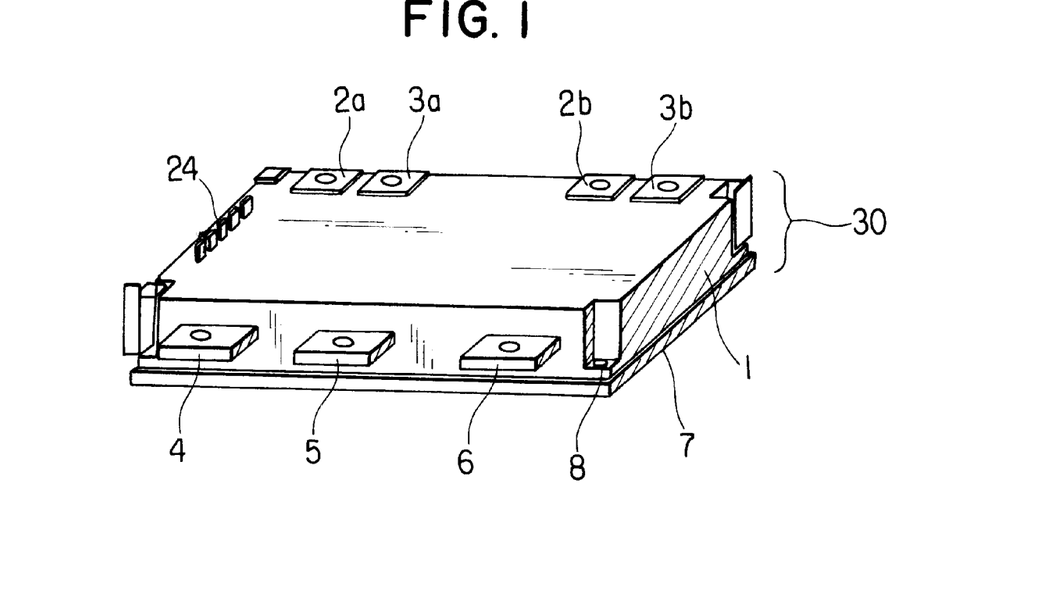
FIG. 1 is a perspective view for illustrating the schematic outside appearance of a semiconductor device module in an embodiment of the present invention.

FIG. 1 is a schematic view of a semiconductor module for illustrating the location of the direct current terminals in the semiconductor device of the present invention.

In FIG. 1, the reference numerals denote the following components, respectively: 1 a case, 2a, 2b the negative-polarity direct current terminals, 3a, 3b the positive-polarity direct current terminals, 4, 5, 6 the output terminals, 7 a metallic baseboard, 8 a screw hole, 24 a control assistance terminal, 30 the semiconductor device. A screw hole for installing wiring is provided in each of the terminals 2a, 2b, 3a, 3b. Also, a hole for installing wiring is provided in each of the output terminals 4, 5, 6. The screw hole 8 is used when a cooling fin and the metallic baseboard 7 are plane-fixed to each other.

FIG. 1 illustrates a configuration where the positive-polarity direct current terminal 3a and the negative-polarity direct current terminal 2a form a pair and the positive-polarity direct current terminal 3b and the negative-polarity direct current terminal 2b form a pair in such a manner that the two pairs are provided side-by-side on one side of the rectangular parallelopiped case 1. Hereinafter, a terminal combination like the above-described one of the terminal 3a and the terminal 2a is referred to as a positive-polarity negative-polarity direct current terminal pair.

Hereinafter, there are illustrated an embodiment of the semiconductor device 30 in FIG. 1 in the electric power conversion device and the inner wiring structure of the semiconductor device 30. Then, the explanation will be given below concerning the problem to be solved by the present invention, i.e., the reduction of the inductances that become the causes of the increase in the loss at the time of the switching and of the breakdown of the semiconductor switch due to the occurrence of the voltage exceeding the element withstand voltage.

Figure 4:
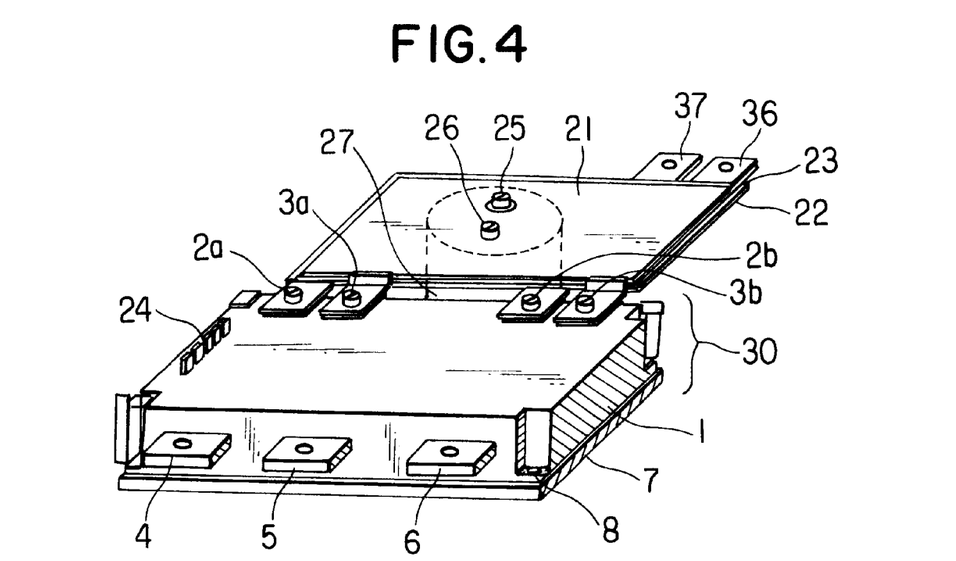
FIG. 4 is a perspective view for illustrating an example of an electric power conversion device using the semiconductor device in FIG. 1.

FIG. 4 illustrates an example where the electrolytic capacitor 27 is connected with the semiconductor device 30 in the electric power conversion device.

In FIG. 4, the reference numerals denote the following components, respectively: 1 the case, 2a, 2b the negative-polarity direct current terminals, 3a, 3b the positive-polarity direct current terminals, 4, 5, 6 the output terminals, 7 the metallic baseboard, 8 the screw hole, 24 the control assistance terminal, 30 the semiconductor device, 21 a positive-polarity side conductive plate, 22 a negative-polarity side conductive plate, 23 an insulating seat, 25, 26 capacitor terminals, 27 the electrolytic capacitor, 36 a positive-polarity side terminal, 37 a negative-polarity side terminal. In FIG. 4, the positive-polarity side conductive plate 21 is plane-connected to the positive-polarity direct current terminals 3a, 3b by screws, and the negative-polarity side conductive plate 22 is plane-connected to the negative-polarity direct current terminals 2a, 2b by screws. Also, the electrolytic capacitor 27 is connected to the negative-polarity side conductive plate 22 and the positive-polarity side conductive plate 21 at the capacitor terminals 25, 26, respectively. The terminals 36, 37 are connected to a direct current power supply. Also, the output terminals 4, 5, 6 are connected to the load.

Figure 2:
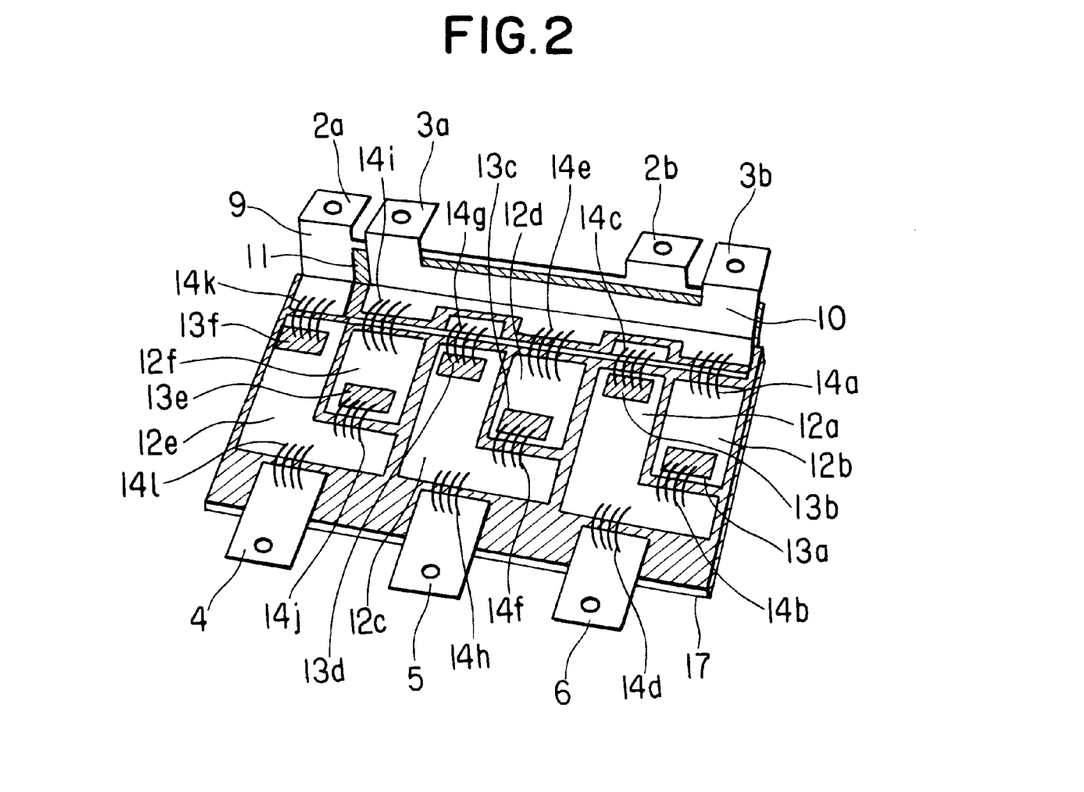
FIG. 2 is a perspective view for illustrating a wiring structure within the semiconductor device in FIG. 1.

FIG. 2 is a perspective view for illustrating the wiring structure including the semiconductor switches and the bridge circuits within the semiconductor device in FIG. 1. The semiconductor device 30 in FIG. 1 is a semiconductor device where the 6 semiconductor switches are bridge-connected.

In FIG. 2, the reference numerals denote the following components, respectively: 2a, 2b the negative-polarity direct current terminals, 3a, 3b the positive-polarity direct current terminals, 4, 5, 6 the output terminals, 9 a negative-polarity side plate-shaped conductor, 10 a positive-polarity side plate-shaped conductor, 11 an insulating seat, 12a, 12b, 12c, 12d, 12e, 12f substrates, 13a, 13b, 13c, 13d, 13e, 13f diodes/semiconductor switches, 14a, 14b, 14c, 14d, 14e, 14f, 14g, 14h, 14i, 14j, 14k, 14l wire wirings, 17 a metallic baseboard.

In FIG. 2, the respective substrates 12a, 12b, 12c, 12d, 12e, 12f have a layer structure consisting of the conductor wiring and the insulating plate. This ensures the insulation between an electrical path on each substrate and the metallic baseboard 17.

In FIG. 2, the case is assumed where the power MOSFET is used as the semiconductor switch, and thus the semiconductor switch combined with the diode is described as one configuration component.

In FIG. 2, the respective wire wirings 14a, 14b, 14c, 14d, 14e, 14f, 14g, 14h, 14i, 14j, 14k, 14l are illustrated in such a manner that the number of the wire wiring is equal to 4. The number of the wire wiring, however, differs depending on the specification of the semiconductor device and a diameter of the wire wiring, and thus the number is not limited to 4.

In FIG. 2, the negative-polarity direct current terminals 2a, 2b is a portion of the negative-polarity side plate-shaped conductor 9, and the positive-polarity direct current terminals 3a, 3b is a portion of the positive-polarity side plate-shaped conductor 10. Moreover, the negative-polarity side plate-shaped conductor 9 and the positive-polarity side plate-shaped conductor 10 form a multilayer structure in which the insulating seat 11 is sandwiched. In the negative-polarity side plate-shaped conductor 9 and the positive-polarity side plate-shaped conductor 10, the directions of the electric currents flowing therein are opposite to each other, and the distance between the conductors is in extreme proximity by the amount of a thickness of the insulating seat. On account of this, these wirings turn out to form a low inductance structure.

Hereinafter, using FIG. 2 and FIG. 4, the explanation will be given concerning the electrical path regarding the above-described jump-up voltage. Although there exist the 3 bridge circuits within the semiconductor device 30, all the electrical paths turn out to become the same after all. Consequently, here, there is explained an electrical path that passes through the bridge circuit including the diodes/semiconductor switches 13a, 13b. Namely, the electrical path is the following path: Starting from the capacitor terminal 26, the electrical path passes through the positive-polarity direct current terminals 3a, 3b from the positive-polarity side conductive plate 21, and from the positive-polarity direct current terminals 3a, 3b, the electrical path passes through in the sequence of the positive-polarity side plate-shaped conductor 10, the wire wiring 14a, the substrate 12b, the diodes/ semiconductor switch 13a, the wire wiring 14b, the substrate 12a, the diodes/semiconductor switch 13b, the wire wiring 14c and the negative-polarity side plate-shaped conductor 9, and from the negative-polarity side plateshaped conductor 9, the electrical path passes through the negative-polarity direct current terminals 2a, 2b, and from the negative-polarity direct current terminals 2a, 2b, the electrical path passes through the negative-polarity side conductive plate 22, finally attaining to the capacitor terminal 25.

In the above-described electrical path in the semiconductor device 30, the employment of the concept explained in the following sequence of 1), 2), and 3) allows the low inductance to be implemented.

1) The 2 or more positive-polarity negative-polarity direct current terminal pairs are provided in the semiconductor device 30. The above-described electrical path is parallelized using the positive-polarity negative-polarity direct current terminal pairs 3a and 2a, 3b and 2b, thereby making it possible to reduce the inductance in the electrical path.

2) The semiconductor device, the positive-polarity side conductive plate 21 and the negative-polarity side conductive plate 20 are connected to each other in one and the same direction, thereby aiming to implement a wiring structure where the positive-polarity side conductive plate 21 and the negative-polarity side conductive plate 22 are formed in a configuration with a less bending and a difference in the inductance from the electrolytic capacitor 27 to the respective positive-polarity negative-polarity direct current terminal pairs is made small, the difference occurring in the positive-polarity side conductive plate 21 and the negative-polarity side conductive plate 22. In order to make this implementation possible, the 2 or more positive-polarity negative-polarity direct current terminal pairs described in 1) are provided side-by-side on the one side of the upper plane of the rectangular parallelepiped case 1 in the semiconductor device 30.

Figure 3:
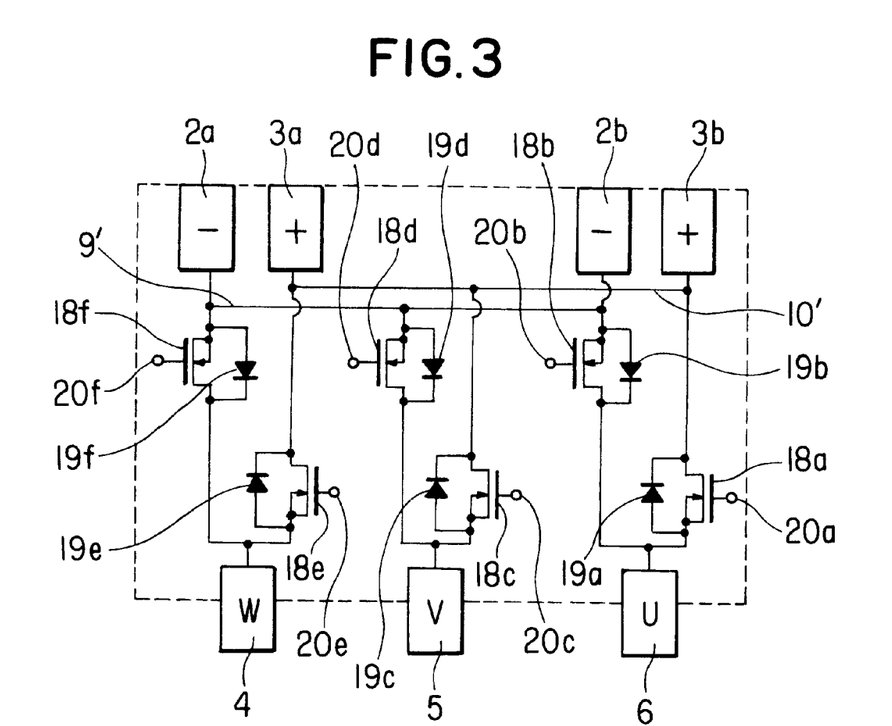
FIG. 3 is a diagram for illustrating a bridge equivalence circuit having semiconductor switches according to an embodiment of the present invention.

3) FIG. 3 illustrates the bridge equivalence circuits in FIG. 2. In FIG. 3, the reference numerals denote the following components, respectively: 2a, 2b the negative-polarity direct current terminals, 3a, 3b the positive-polarity direct current terminals, 4, 5, 6 the output terminals, 18a, 18b, 18c, 18d, 18e, 18f the semiconductor switches, 19a, 19b, 19c, 19d, 19e, 19f the diodes, 20a, 20b, 20c, 20d, 20e, 20f the semiconductor switching control terminals. Also, reference numerals 9', 10' correspond to the portion in which, on the equivalence circuits, the negative-polarity side plate-shaped conductor 9 and the positive-polarity side plate-shaped conductor 10 are multilayered so that the two conductors form the low inductance structure. In the equivalence circuits in FIG. 3, however, when taking, as an example, the above-described electrical path that passes through the bridge circuit including the semiconductor switches 18a, 18b, between a path extending from the positive-polarity negative-polarity direct current terminal pair including the terminals 2a, 3a to the semiconductor switches 18a, 18b and a path extending from the positive-polarity negative-polarity direct current terminal pair including the terminals 2b, 3b to the semiconductor switches 18a, 18b, there occurs a difference in the inductance by the amount of a difference between the inductances in the paths 9' and 10'. The larger the difference in the inductance is, the more likely it becomes for the electric current to flow into the path with a less inductance. This reduces and lowers the effect of parallelizing the electrical path with the provision of the 2 or more positive-polarity negative-polarity direct current terminal pairs in the semiconductor device as was described in 1). In order to prevent this, as illustrated in FIG. 2, the negative-polarity side plate-shaped conductor 9 and the positive-polarity side plate-shaped conductor 10 are multilayered so that the paths 9' and 10' form the low-inductance structure.

In accordance with the above-described 1), 2) and 3), in the semiconductor device 30 and the electric power conversion device using it, it is possible to parallelize the electrical path extending from the electrolytic capacitor 27 to the positive-polarity negative-polarity direct current terminal pairs 2a and 3a, 2b and 3b and the electrical path of the bridge wiring within the semiconductor device. In addition to this, the portion of the bridge wirings within the semiconductor device is made to form the multilayer structure and the positive-polarity negative-polarity direct current terminal pairs 2a and 3a, 2b and 3b are provided on the one side of the upper plane of the rectangular parallelepiped case 1, thereby enhancing the inductance-reducing effect based on the parallelizing of the electrical path. Accordingly, it is possible to reduce the inductances as a whole that determine the magnitude of the jump-up voltage in the semiconductor device 30 and the electric power conversion device using it. This condition, eventually, prevents the increase in the jump-up voltage at the time of the switching and the accompanying element breakdown, reducing at the same time the power loss that accompanies the increase in the jump-up voltage.

Also, in the present embodiment, within the semiconductor device 30, the portion 9' and 10' in FIG. 3 is made to exhibit the low inductance. As a result, it has been implemented to lessen a difference in the inductances that determines the magnitudes of the jump-up voltages in the 3 bridge circuits. This condition decreases a difference in the jump-up voltages in the 3 bridge circuits, thereby resulting in an effect of being also able to provide a semiconductor device with an excellent balance between the current and voltage outputs.

Here, employing the structure in FIG. 4 as an example and using concrete numerical values, the explanation will be given below concerning the effects in the present embodiment. Hereinafter, the dimensions of the semiconductor device are set to be 120 mm longitudinal, 140 mm transverse, and 30 mm high. Moreover, the electric power conversion device is assumed that uses the semiconductor switch with the element withstand voltage of 100V and a falling time of 300 nsec under the conditions that the direct voltage is equal to 40V and a shielding electric current is equal to 250 A.

When the wiring structure in FIG. 2 is implemented in accordance with the above-described module dimensions, the inductance in the following electrical path is equal to about 35 nH: Starting from the positive-polarity direct current terminal 3a, the electrical path passes through in the sequence of the positive-polarity side plate-shaped conductor 10, the wire wiring 14a, the substrate 12b, the diodes/semiconductor switch 13a, the wire wiring 14b, the substrate 12a, the diodes/semiconductor switch 13b, the wire wiring 14c and the negative-polarity side plate-shaped conductor 9, and from the negative-polarity side plate-shaped conductor 9, the electrical path passes through the negative-polarity direct current terminal 2a. The breakdown thereof is as follows: The inductance occurring in a non-multilayer structure of the positive-polarity direct current terminal 3a and the negative-polarity direct current terminal 2a is equal to about 15 nH, the inductance occurring in the multilayered wirings 9, 10 is equal to about 5 nH, and the inductance in an electrical path including the bonding wires 14, the substrates 12a, 12b and the semiconductor elements 13a, 13b is equal to about 15 nH.

Also, the inductance in the following electrical path is equal to about 30 nH: Starting from the positive-polarity direct current terminal 3b, the electrical path passes through in the sequence of the positive-polarity side plate-shaped conductor 10, the wire wiring 14a, the substrate 12b, the diodes/semiconductor switch 13a, the wire wiring 14b, the substrate 12a, the diodes/semiconductor switch 13b, the wire wiring 14c and the negative-polarity side plate-shaped conductor 9, and from the negative-polarity side plate-shaped conductor 9, the electrical path passes through the negative-polarity direct current terminal 2b. In the wiring structure in the present invention, a difference between the inductances in the above-described 2 paths is made small by multilayering the wirings 9, 10 that give rise to the difference. Although the above-described inductances are varied depending on the number of the bonding wires 14 and a rooftop height, they are presented as implementable numerical values. As illustrated in FIG. 4, this semiconductor device 30 is connected with the electrolytic capacitor 27, using the positive-polarity side conductive plate 21 and the negative-polarity side conductive plate 22. In the present investigative presentation, the inner inductance value of the electrolytic capacitor 27 is assumed to be equal to 20 nH. Assuming that the distance between the capacitor terminals 25, 26 is equal to about 30 mm, the inductance seen from the capacitor terminals at the time of short-circuiting the terminals 2a, 3a is equal to about 30 nH. The breakdown thereof is as follows: The inductance resulting from the fact that the electric currents do not flow in the opposite directions in the capacitor terminals 25, 26 is equal to about 10 nH, the inductance occurring in a portion in proximity to the direct terminals of semiconductor device 30 where the positive-polarity side conductive plate 21 and the negative-polarity side conductive plate 22 form a non-multilayer structure is equal to about 15 nH, and the inductance occurring in the multilayer structure portion of the positive-polarity side conductive plate 21 and the negative-polarity side conductive plate 22 is equal to about 5 nH.

As is the case with the above-described explanation, the inductance seen from the capacitor terminals 25, 26 at the time of short-circuiting the terminals 2b, 3b is similarly equal to about 30 nH. From the above-described inductance breakdown in the respective portions and the inner inductance of the electrolytic capacitor 27, when calculating approximately the inductance in the electrical path that extends from the electrolytic capacitor to the bridge wirings within the semiconductor device and exerts an outstanding influence on the jump-up voltage, in the present embodiment, the calculation result becomes equal to about 50 nH on account of the effect of parallelizing the electrical path. Then, adding the inner inductance of the electrolytic capacitor to the above-described inductance in the electrical path and calculating approximately a peak voltage applied to the semiconductor switch, through the use of the calculation formula: {(the direct voltage)+(the inductance)×(the shielding electric current)÷(the falling time)}, the calculation result becomes equal to about 82V. This is a value having a sufficient degree of the design allowance with reference to the element withstand voltage.

Meanwhile, when calculating the inductance by regarding the wiring structure in the conventional system as being equivalent to the case where there exist none of the positive-polarity direct current terminal 3b and the negative-polarity direct current terminal 2b, the calculation result becomes equal to about 75 nH. In this case, the approximate calculation of the peak voltage applied to the semiconductor switch brings about a value of about 103V. Namely, the peak voltage exceeds the element withstand voltage. This situation means that, unless some other modification is performed, it is impossible to implement the semiconductor device and the electric power conversion device in the present specification.

Figure 5:
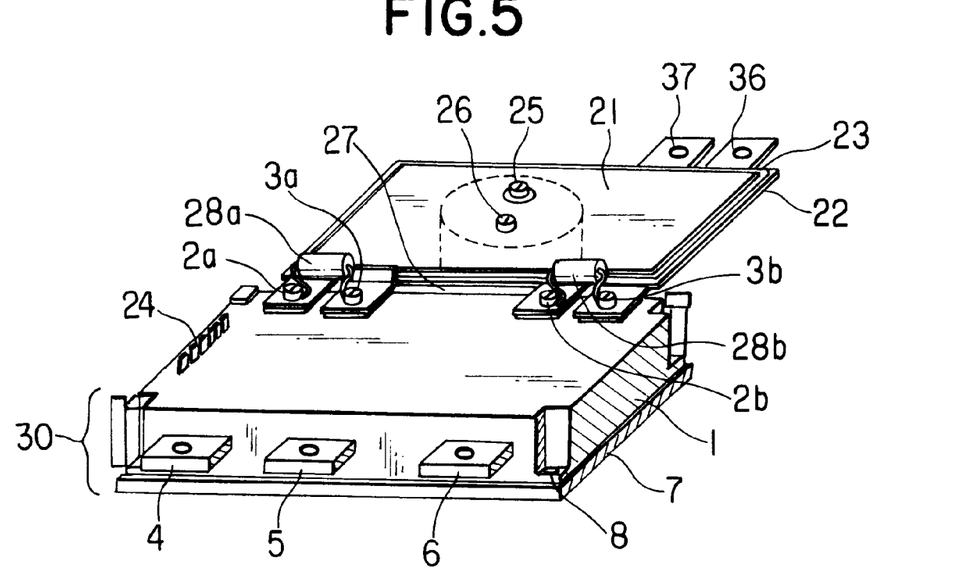
FIG. 5 is a perspective view for illustrating another example of the electric power conversion device using the semiconductor device in FIG. 1.

Next, the explanation will be given below concerning the semiconductor device and the electric power conversion device where capacitors 28a, 28b are implemented in the positive-polarity negative-polarity direct current terminal pairs in the semiconductor device. FIG. 5 is a schematic view for illustrating the electric power conversion device where the capacitors 28a, 28b are implemented in the positive-polarity negative-polarity direct current terminal pairs in the semiconductor device.

In FIG. 5, the reference numerals denote the following components, respectively: 1 the case, 2a, 2b the negative-polarity direct current terminals, 3a, 3b the positive-polarity direct current terminals, 4, 5, 6 the output terminals, 7 the metallic baseboard, 8 the screw hole, 21 the positive-polarity side conductive plate, 22 the negative-polarity side conductive plate, 23 the insulating seat, 24 the control assistance terminal, 25, 26 the capacitor terminals, 27 the electrolytic capacitor, 28a, 28b the capacitors, 36 the positive-polarity side terminal, 37 the negative-polarity side terminal. The capacitors 28a, 28b charge/discharge only a high frequency electric current that flows at the time of the switching, and accordingly the capacitance thereof may be exceedingly smaller as compared with that of the electrolytic capacitor 27. On account of this, it is possible to use a film capacitor the capacitance of which is in the range of about 1 μF to 10 μF and which has an excellent high frequency characteristic, i.e., has a small inductance. This condition makes the compact implementation possible.

Hereinafter, using FIG. 2 and FIG. 5, the explanation will be given concerning electrical paths regarding the jump-up voltage in the semiconductor device and the electric power conversion device in FIG. 5. Here, there are explained electrical paths that pass through the bridge circuit including the diodes/semiconductor switches 13a, 13b. Namely, in the present structure, the electrical paths are the following 2 paths: One of the electrical paths, starting from the capacitor 28a, passes through in the sequence of the positive-polarity direct current terminal 3a, the positive-polarity side plate-shaped conductor 10, the wire wiring 14a, the substrate 12b, the diodes/semiconductor switch 13a, the wire wiring 14b, the substrate 12a, the diodes/semiconductor switch 13b, the wire wiring 14c and the negative-polarity side plate-shaped conductor 9, and from the negative-polarity side plate-shaped conductor 9, one of the electrical paths passes through the negative-polarity direct current terminal 2a, finally returning back to the capacitor 28a. The other electrical path, starting from the capacitor 28b, passes through in the sequence of the positive-polarity direct current terminal 3b, the positive-polarity side plate-shaped conductor 10, the wire wiring 14a, the substrate 12b, the diodes/semiconductor switch 13a, the wire wiring 14b, the substrate 12a, the diodes/semiconductor switch 13b, the wire wiring 14c and the negative-polarity side plate-shaped conductor 9, and from the negative-polarity side plate-shaped conductor 9, the other electrical path passes through the negative-polarity direct current terminal 2b, finally returning back to the capacitor 28b. The portion extending from the wire wiring 14a to the wire wiring 14c is common to the above-described 2 paths.

Concerning the inductance regarding the jump-up voltage, the structure in FIG. 5 includes none of the inductance occurring in the positive-polarity side conductive plate 21 and the negative-polarity side conductive plate 22, the inductances of the capacitors 28a, 28b are smaller as compared with the inner inductance of the electrolytic capacitor 27, and the 2 capacitors 28a, 28b are parallelized. These conditions allow a lower inductance to be implemented in comparison with the inductance in the structure in FIG. 4.

Consequently, the structure in FIG. 5 makes it possible to provide a semiconductor device that does not depend on the wiring structure of the positive-polarity side conductive plate 21, the negative-polarity side conductive plate 22, and the electrolytic capacitor 27.

Figure 6:
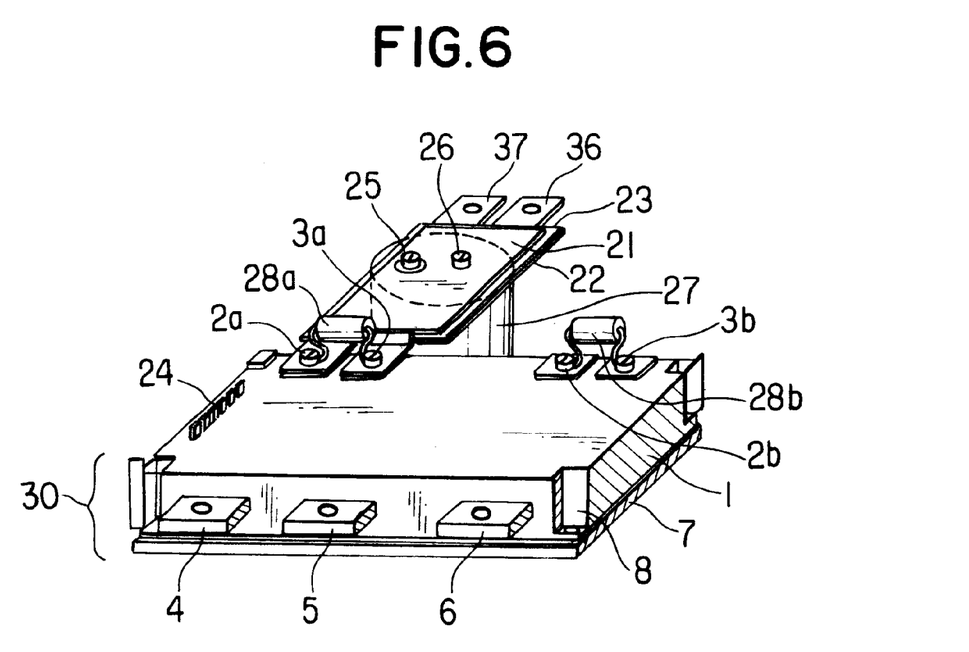
FIG. 6 is a perspective view for illustrating still another example of the electric power conversion device using the semiconductor device in FIG. 1.

FIG. 6 illustrates an application example of a structure where the capacitors 28a, 28b are connected to the 2 positive-polarity negative-polarity direct current terminal pairs in FIG. 5.

In FIG. 6, the reference numerals denote the following components, respectively: 1 the case, 2a, 2b the negative-polarity direct current terminals, 3a, 3b the positive-polarity direct current terminals, 4, 5, 6 the output terminals, 7 the metallic baseboard, 8 the screw hole, 21 the positive-polarity side conductive plate, 22 the negative-polarity side conductive plate, 23 the insulating seat, 24 the control assistance terminal, 25, 26 the capacitor terminals, 27 the electrolytic capacitor, 28a, 28b the capacitors, 36 the positive-polarity side terminal, 37 the negative-polarity side terminal.

As compared with the structure in FIG. 5, the structure in FIG. 6 is a structure where the positive-polarity side conductive plate 21 and the negative-polarity side conductive plate 22 are connected to only the positive-polarity direct current terminal 3a and the negative-polarity direct current terminal 2a, respectively. Concerning the inductance determining the jump-up voltage, the structure in FIG. 6 makes it possible to implement a low inductance that is substantially equal to the low inductance implemented in the structure in FIG. 5.

The example in FIG. 6 indicates the following: In designing the wiring structure of the electric power conversion device with the objective of reducing the inductance, the semiconductor device 30 is of the structure that permits its flexible design that does not depend on the configurations of the positive-polarity side conductive plate 21 and the negative-polarity side conductive plate 22.

Here, employing the structures in FIGS. 5, 6 as examples and using concrete numerical values, the explanation will be given below concerning the effects in the present embodiment. Hereinafter, the dimensions of the semiconductor device are set to be 120 mm longitudinal, 140 mm transverse, and 30 mm high. Moreover, the electric power conversion device is assumed that uses the semiconductor switch with the element withstand voltage of 100 V and the falling time of 300 nsec under the conditions that the direct voltage is equal to 40 V and the shielding electric current is equal to 400 A.

The inductance in the following electrical path is equal to about 35 nH: Starting from the positive-polarity direct current terminal 3a, the electrical path passes through in the sequence of the positive-polarity side plate-shaped conductor 10, the wire wiring 14a, the substrate 12b, the diodes/semiconductor switch 13a, the wire wiring 14b, the substrate 12a, the diodes/semiconductor switch 13b, the wire wiring 14c and the negative-polarity side plate-shaped conductor 9, and from the negative-polarity side plate-shaped conductor 9, the electrical path passes through the negative-polarity direct current terminal 2a. The breakdown thereof is as follows: The inductance occurring in the non-multilayer structure of the positive-polarity direct current terminal 3a and the negative-polarity direct current terminal 2a is equal to about 15 nH, the inductance occurring in the multilayered wirings 9, 10 is equal to about 5 nH, and the inductance in the electrical path including the bonding wires 14, the substrates 12a, 12b and the semiconductor elements 13a, 13a, is equal to about 15 nH.

Also, the inductance in the following electrical path is equal to about 30 nH: Starting from the positive-polarity direct current terminal 3b, the electrical path passes through in the sequence of the positive-polarity side plate-shaped conductor 10, the wire wiring 14a, the substrate 12b, the diodes/semiconductor switch 13a, the wire wiring 14b, the substrate 12a, the diodes/semiconductor switch 13b, the wire wiring 14c and the negative-polarity side plate-shaped conductor 9, and from the negative-polarity side plate-shaped conductor 9, the electrical path passes through the negative-polarity direct current terminal 2b.

In the structures in FIGS. 5, 6, the electrical current paths that exert the outstanding influence on the jump-up voltage becomes only the electrical paths that extend from the capacitors 28a, 28b to the bridge wirings within the semiconductor device. Here, the inductance of the capacitors 28a, 28b is assumed to be equal to 10 nH. At this time, the inductance that exerts the outstanding influence on the jump-up voltage value becomes equal to about 25 nH on account of the effect of parallelizing the electrical paths. In this case, the peak voltage applied to the semiconductor switch becomes equal to about 73V. This is a value having a sufficient degree of the design allowance with reference to the element withstand voltage.

Meanwhile, when calculating the inductance by regarding the wiring structure in the conventional system as being equivalent to the case where there exist none of the positive-polarity direct current terminal 3b and the negative-polarity direct current terminal 2b, the inductance becomes equal to about 45 nH. In this case, the peak voltage applied to the semiconductor switch becomes equal to about 100V. Namely, the peak voltage exhibits no allowance toward the element withstand voltage. This situation means that, unless some other modification is performed, it is impossible to implement the semiconductor device and the electric power conversion device in the present specification. In the present investigative presentation, the capacitance of the capacitors 28a, 28b required for the purpose of suppressing the jump-up voltage is in the range of about 5 $\mu$F to 10 $\mu$F.

Figure 7:
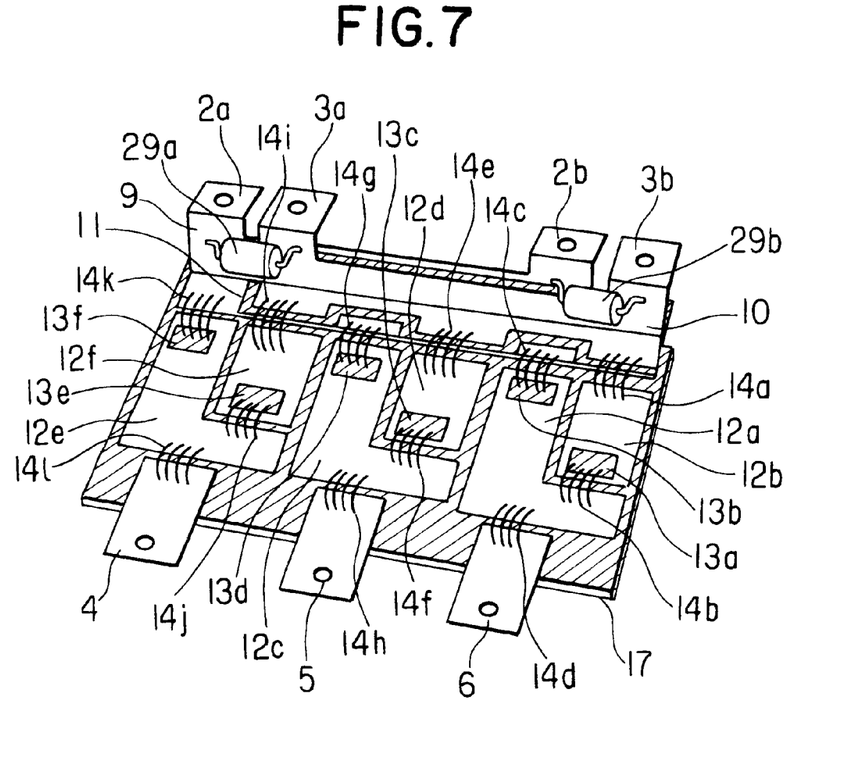
FIG. 7 is a schematic perspective view for illustrating a wiring structure of an embodiment of the present invention.

FIG. 7 illustrates a structure where, within the case 1, a capacitor 29a between the positive-polarity direct current terminal 3a and the negative-polarity direct current terminal 2a is connected to a capacitor 29b between the positive-polarity direct current terminal 3b and the negative-polarity direct current terminal 2b. In FIG. 7, the reference numerals denote the following components, respectively: 2a, 2b the negative-polarity direct current terminals, 3a, 3b the positive-polarity direct current terminals, 4, 5, 6 the output terminals, 9 the negative-polarity side plate-shaped conductor, 10 the positive-polarity side plate-shaped conductor, 11 the insulating seat, 12a, 12b, 12c, 12d, 12e, 12f the substrates, 13a, 13b, 13c, 13d, 13e, 13f the diodes/semiconductor switches, 14a, 14b, 14c, 14d, 14e, 14f, 14g, 14h, 14i, 14j, 14k, 14l the wire wirings, 17 the metallic baseboard, 29a, 29b the capacitors.

In FIG. 7, the case is assumed where the power MOSFET is used as the semiconductor switch, and thus the semiconductor switch combined with the diode is described as one configuration component.

From the viewpoint of reducing the inductance, the structure in FIG. 7 exhibits the same effect as that of the structures in FIGS. 5, 6. The schematic outside appearance as a semiconductor device, however, becomes the same as that of the structure in FIG. 1. Thus, as compared with the structures in FIGS. 5, 6, the structure in FIG. 7 has an advantage of being made compact. This advantage results from implementing the capacitors 29a, 29b within the case 1.

In FIGS. 1 to 7, the positive-polarity direct current terminals 3a, 3b and the negative-polarity direct current terminals 2a, 2b are provided on the one side of the upper plane of the case 1 in the sequence of 2a, 3a, 2b, 3a, in the semiconductor device 30. In the present embodiment, however, as long as the terminals 3a and 2a and the terminals 3b and 2b form a pair, respectively, it is possible to implement the reduction of the inductance described in the above-mentioned 1), 2), 3). Consequently, in the semiconductor device 30, the direct current terminals on the upper plane of the case 1 may also be located in the sequence of 2a, 3a, 3b, 2b, or in the sequence of 3a, 2a, 2b, 3b.

In FIGS. 1 to 7, the presentation has been given concerning the semiconductor device structure and the electric power conversion device that solve the problem of reducing the inductance with the use of the semiconductor device 30 where the 6 semiconductor switches are bridge-connected. The present embodiment, however, relates to the structure of the positive-polarity direct current terminals, the negative-polarity direct current terminals, the negative-polarity side plate-shaped conductor 9, and the positive-polarity side plate-shaped conductor 10 in the semiconductor device. Accordingly, the effect of the present embodiment is applicable to the various types of structures of the diodes/semiconductor switches 13a, 13b, 13c, 13d, 13e, 13f, the wire wirings 14a, 14b, 14c, 14d, 14e, 14f, 14g, 14h, 14i, 14j, 14k, 14l that are directly connected to the diodes/semiconductor switches, and the substrates 12a, 12b, 12c, 12d, 12e, 12f. For example, towards a semiconductor device where the 2 semiconductor switches are bridge-connected, the effect of the present embodiment is applicable by, as is the case with the semiconductor device 30, multilayering at least a portion of the conductors that bridge-connect the semiconductor switches and providing the 2 or more positive-polarity negative-polarity direct current terminal pairs side-by-side on one side of an upper plane of the case. Consequently, the effect of the present embodiment is also applicable to a semiconductor device that includes at least 2 of the bridge-connected semiconductor switches.

In FIGS. 1 to 7, the presentation has been given employing, as the example, the semiconductor device 30 that has the 2 positive-polarity negative-polarity direct current terminal pairs. However, the inductance-reducing mechanism by the parallelizing of the positive-polarity negative-polarity direct current terminal pairs makes it possible to obtain the same effect even if 3 or more positive-polarity negative-polarity direct current terminal pairs described are parallelized on the one side of the upper plane of the case.

Also, concerning the positive-polarity negative-polarity direct current terminal pairs in the semiconductor device 30 as well, the inductance-reducing mechanism by the parallelizing of the positive-polarity negative-polarity direct current terminal pairs makes it possible to obtain the same effect even in the following case: The 2 positive-polarity direct current terminals and the 1 negative-polarity direct current terminal or the 1 positive-polarity direct current terminal and the 2 negative-polarity direct current terminals are regarded as 1 pair of the positive-polarity negative-polarity direct current terminal pair, then being parallelized on the one side of the upper plane of the case.

The semiconductor device having the above-described wiring and wiring structure or the semiconductor device where the capacitors are connected to the terminals of the semiconductor device, and the wiring structure of the electric power conversion device using these semiconductor devices exhibit effects of preventing the breakdown of the semiconductor elements caused by the fact that the voltage exceeding the withstand voltage of the semiconductor switch is applied at the time of the switching and of reducing the loss of the semiconductor elements at the time of the switching. The above-described effects allow greater electric current outputting semiconductor device and electric power conversion device to be provided by an inexpensive method of the modification of the wiring structure of the semiconductor device and the electric power conversion device. Namely, the structure of the semiconductor device and the electric power conversion device using it are disclosed, the structure making it possible to reduce the inductances that become the causes of the increase in the jump-up voltage at the time of the switching in the semiconductor device and of the element breakdown and the increase in the power loss that accompany the increase in the jump-up voltage.

What is claimed is:

1. A semiconductor device, comprising:
two bridge-connected semiconductor switches;
an output terminal;
a first pair of positive and negative direct current terminals, and a second pair of positive and negative direct current terminals;
first conductors for connecting the negative direct current terminals of said first and second pairs with said output terminal through one of said two-bridge-connected semiconductor switches;
second conductors for connecting the positive direct current terminals of said first and second pairs with the other of said two bridge-connected semiconductor switches; and
a housing for including said two bridge-connected semiconductor switches, wherein
at least a portion of a first conductor and a second conductor has a multilayer structure formed by sandwiching an insulator between said first and second conductors inside said housing; and
said first pair and second pair of direct current terminals are arranged on one side of one plane of said housing.

2. A semiconductor device, comprising:
six bridge-connected semiconductor switches;
one set of 3-phase alternating current terminals;
a first pair of positive and negative direct current terminals, and a second pair of positive and negative direct current terminals;
first conductors for connecting the negative direct current terminals of said first and second pairs with said 3-phase alternating current terminals through said six bridge-connected semiconductor switches;
second conductors for connecting the positive direct current terminals of said first and second positive and negative direct current terminal pairs with said six semiconductor switches; and
a case and a baseboard for including said six semiconductor switches, wherein
at least a portion of a first conductor and a second conductor has a multilayer structure formed by sandwiching an insulator between said first and second conductors inside said housing; and
said first and second p airs of direct current terminals are arranged on one side of an upper plane of said case.

3. A semiconductor device, comprising:
an insulator sandwiched between at least a portion of a positive-polarity side conductor and at least a portion of a negative-polarity side conductor inside a case of said semiconductor device, said conductors bridge-connecting semiconductor switches in said semiconductor device; and
two positive-polarity direct current terminals and two negative-polarity direct current terminals provided respectively on said positive-polarity side conductor and said negative-polarity side conductor, wherein
one of said two positive-polarity terminals on said positive-polarity side conductor and one of said two negative-polarity terminal of said negative-polarity side conductor form a first pair of positive-polarity and negative-polarity direct current terminals;
the other of said two positive-polarity terminals on said positive polarity side conductor, and the other of said two negative polarity terminals of
said negative polarity side conductor form a second pair of positive-polarity and negative-polarity direct current terminals; and
said positive-polarity direct current terminals and said negative-polarity direct current terminals are provided on one side of an upper plane of a said case of said semiconductor device.

4. The semiconductor device as claimed in claim 1, wherein a capacitor is connected to a point between each pair of positive and negative direct current terminals.

5. The semiconductor device as claimed in claim 2, wherein a capacitor is connected to a point between each pair of positive and negative direct current terminals.

6. The semiconductor device as claimed in claim 3, wherein a capacitor is connected to a point between each pair of positive and negative direct current terminals.

7. The semiconductor as claimed in claim 2, wherein at least said portions of said conductors are provided on said baseboard, through said insulator.

8. An electric power conversion device, comprising:
   a semiconductor device, comprising:
      two bridge-connected semiconductor switches;
      an output terminal;
      a first pair of positive and negative direct current terminals and a second pair of positive and negative direct current terminals;
      first conductors for connecting the negative direct current terminals of said first and second pairs with said output terminal through one of said two bridges-connect semiconductor switches;
      second conductors for connecting the positive direct current terminals of said first and second pairs with the other of said two bridge-connected semiconductor switches; and
      a housing for including said two bridge-connected semiconductor switches, wherein
         at least a portion of a first conductor and a second conductor has a multilayer structure formed by sandwiching an insulator between said first and second conductors inside said housing; and
         said first and second pairs of direct current terminals are arranged on one side of one plane of said housing; and
         an electrolytic capacitor is connected to said direct current terminals of said semiconductor device.

9. The electric power conversion device as claimed in claim 4, wherein
   one terminal of said electrolytic capacitor is connected to a positive-polarity side of said direct current terminals of said semiconductor device, and another terminal of said electrolytic capacitor is connected to a negative-polarity side of said direct current terminals of said semiconductor device.

10. The electric power conversion device as claimed in claim 9, wherein said semiconductor device converts a direct current to an alternating current with a variable voltage and a variable frequency, said electrolytic capacitor suppressing a variation in said direct current.

11. An electric power conversion device, which includes a semiconductor device, comprising:
   six bridge-connected semiconductor switches, one set of 3-phase alternating current terminals;
   a first pair of positive and negative direct current terminals and a second pair of positive and negative direct current terminals;
   first conductors for connecting the negative direct current terminals of said first and second pairs with said 3-phase alternating current terminals through said six bridge-connected semiconductor switches;
   second conductors for connecting the positive direct current terminals of said first and second positive and negative direct current terminal pairs with said six semiconductor switches; and
   a case and a baseboard for including said six semiconductor switches, wherein
      at least a portion of a first conductor and a second conductor has a multilayer structure formed by sandwiching an insulator between said first and second conductors inside said case; and
      said first and second pairs of direct current terminals are arranged on one side of an upper plane of said case;
      said semiconductor device includes said 3-phase alternating current terminals into which an alternating current is inputted;
      an electrolytic capacitor is connected to said direct current terminals of said semiconductor device; and
      said direct current terminals of said semiconductor device are connected to said electrolytic capacitor.

* * * * *